(12) United States Patent
Svensson

(10) Patent No.: US 7,965,127 B2
(45) Date of Patent: Jun. 21, 2011

(54) DRIVE CIRCUIT FOR A POWER SWITCH COMPONENT

(75) Inventor: Andreas Svensson, Tibro (SE)

(73) Assignee: Telefonaktiebolaget L M Ericsson (Publ), Stockton (SE)

( * ) Notice: Subject to any disclaimer, the term of this patent is extended or adjusted under 35 U.S.C. 154(b) by 0 days.

(21) Appl. No.: 12/681,660

(22) PCT Filed: Oct. 5, 2007

(86) PCT No.: PCT/SE2007/050713
§ 371 (c)(1),
(2), (4) Date: Apr. 13, 2010

(87) PCT Pub. No.: WO2009/045137
PCT Pub. Date: Apr. 9, 2009

(65) Prior Publication Data
US 2010/0237911 A1    Sep. 23, 2010

(51) Int. Cl.
H03K 17/687    (2006.01)
(52) U.S. Cl. ........ 327/427; 327/374; 327/309; 327/108; 327/437; 326/21; 326/84
(58) Field of Classification Search .......... 327/108–112, 327/427, 434, 437, 374–377, 379, 309–313, 327/314, 323; 326/21–24, 82–84, 89
See application file for complete search history.

(56) References Cited

U.S. PATENT DOCUMENTS 6,154,069 A * 11/2000 Ebihara .................... 327/112
7,330,063 B2 * 2/2008 Ferianz .................... 327/309
* cited by examiner Primary Examiner — Lincoln Donovan
Assistant Examiner — Shikha Goyal

(57) ABSTRACT

A drive circuit for a power switch component.

6 Claims, 2 Drawing Sheets

DRIVE CIRCUIT FOR A POWER SWITCH COMPONENT

TECHNICAL FIELD

The present invention relates to a driving circuit for driving, for example, a power mosfet.

BACKGROUND AND RELATED ART

For gate driving of large power train components, such as power mosfets, a number of solutions are known in the art. For example a number of different integrated circuits exists that are suitable for this purpose. These devices are expensive, and have specific properties, so that they are not interchangeable. This means that when a particular type of integrated circuit from a particular vendor has been selected for an application it cannot easily be replaced by another type of integrated circuit.

Drive circuits based on bipolar transistors are also known. Such drive circuits are known to be more complex to achieve the same result.

There is a desire to achieve a negative voltage on the gate of the transistor that drives the output signal to saturate it completely. In the prior art solutions based on bipolar transistors or integrated circuits this is achieved by adding an additional voltage source for providing the negative voltage, or using inverted driving stages in common emitter style, which results in a more complex design.

SUMMARY OF THE INVENTION

The invention aims to provide a more flexible drive circuit for a power switch component.

According to the present invention a drive circuit for a power switch component is provided, said drive circuit comprising an input terminal for receiving a drive pulse, a first semiconductor component and a second semiconductor component, each semiconductor component having a controllable terminal, a voltage amplifying terminal and a current amplifying terminal, the current amplifying terminals of said first and second transistors being interconnected, the voltage amplifying terminal of the first semiconductor component being connected to a first power rail and the voltage amplifying terminal of the second semiconductor component being connected to a second power rail, the first power rail being at a higher potential than the second power rail, the controllable terminals of the first and second semiconductor components being interconnected, a resistor and a diode being connected in parallel between said controllable terminals and the input terminal, and a capacitor being connected between said controllable terminals and said current amplifying terminals, wherein each of said semiconductor components has a diode connected between its current amplifying terminal and its voltage amplifying terminal.

The drive circuit according to the invention is based on transistors, which are substantially equivalent independently of the manufacturer or supplier. Hence, the selection of a drive circuit does not result in dependency of a particular type of component from a particular vendor. Also, the drive circuit can be implemented at a relatively low cost.

With the drive circuit according to the invention a saturated drive voltage to both negative and positive supply rail voltage can be achieved using only one power supply rail. The output voltage can be driven up to the rail voltage and down to the negative rail voltage even if the drive voltage is lower than the positive rail voltage, and negative rail voltage, using only one power source. The delay time of the drive circuit is adjustable. Further, the change in current with respect to time, di/dt, and the change in voltage with respect to time, dv/dt, can be made very fast.

In a first preferred embodiment the first and second semiconductor components are mosfets. In this case, the controllable terminals are the gates of the mosfets, the voltage amplifying terminals are the drains and the current amplifying terminals are the sources. The diodes are body-drain diodes, which are inherent in the mosfets.

In a second preferred embodiment the first and second semiconductor components are bipolar transistors. In this case the controllable terminals are the bases of the transistors, the voltage amplifying terminals are the collectors and the current amplifying terminals are the emitters. Bipolar transistors do not have inherent body-drain diodes in the way that mosfets do; therefore, separate diodes, connected in the same way as the body-drain diodes of the mosfets, must be provided when using bipolar transistors.

In a third embodiment the first and second semiconductor components are Isolated Gate Bipolar Transistors (IGBT). In this case the controllable terminals are the gates of the transistors, the voltage amplifying terminals are the drains and the current amplifying terminals are the sources. As for the bipolar transistors, separate diodes connected, in the same way as the body-drain diodes of the mosfets, are provided.

The potentials of the first and second power rails may be selected in different ways. For example, the second power rail may be neutral while the first power rail has a positive potential. Alternatively, the first power rail may neutral and the second power rail has a negative potential. The important thing is that the first power rail has a higher potential than the second power rail.

BRIEF DESCRIPTION OF THE DRAWINGS

The invention will be described in more detail in the following, by way of example and with reference to the appended drawings in which.

DETAILED DESCRIPTION OF EMBODIMENTS

Figure 1:
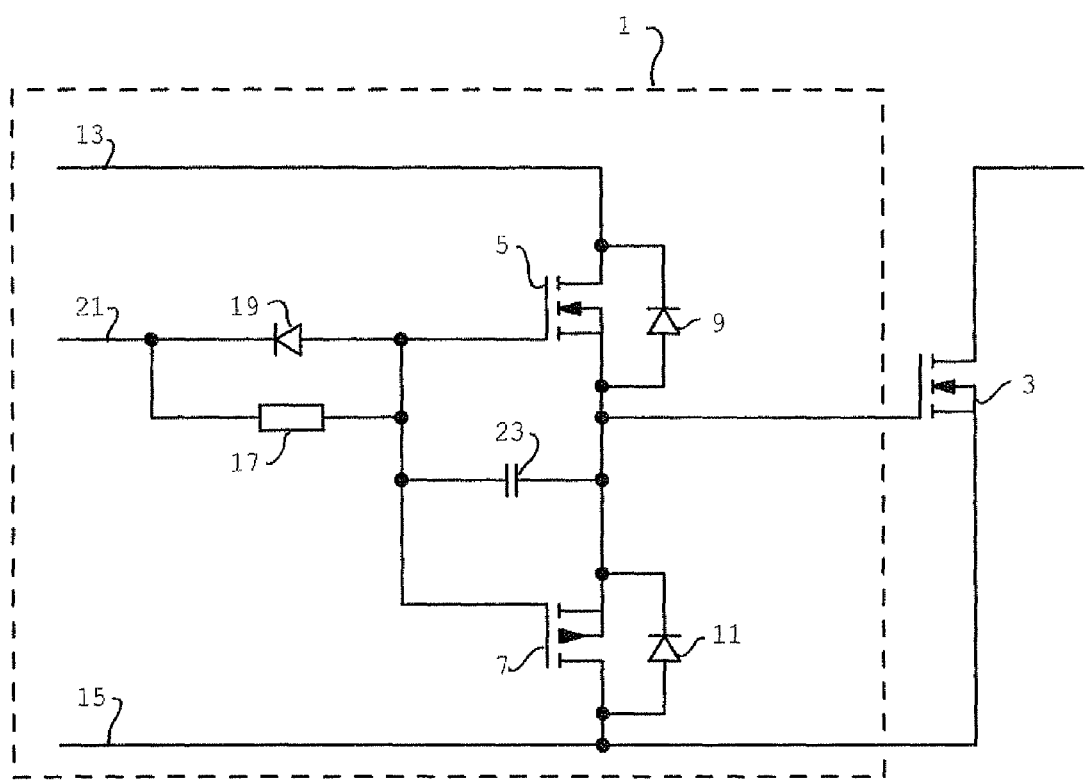
FIG. 1 illustrates a drive circuit according to a preferred embodiment of the invention, driving a mosfet.

FIG. 1 illustrates a drive circuit according to a preferred embodiment of the invention. The drive circuit is arranged in this example to drive a power switch component 3. The driven component could be, for example, a mosfet, a bipolar transistor or, an Isolated Gate Bipolar Transistor (IGBT). The drive circuit comprises a first, n-channel, mosfet 5 and a second, p-channel, mosfet 7 that are connected to each other by the gates and the sources. Diodes 9, 11, referred to as body-drain diodes, from the source to the drain of the n channel mosfet 5 and from the drain to the source of the p channel mosfet 7, are inherent in the mosfets. The drain of the n-channel mosfet 5 is connected to a positive branch 13 of a power source. The drain of the p-channel mosfet 7 is connected to a neutral branch 15 of the power source. The gates of the mosfets 5, 7 are connected to a first end of a resistor 17 connected in parallel with a diode 19 whose anode is facing the gates. The other end of the resistor 17, and the cathode of the diode 19 are connected to an input terminal 21 arranged to receive a control signal for the drive circuit 1. Between the first end of the resistor 17 and the anode end of the diode 19 on one side and the sources of the mosfets 5, 7 on the other side a capacitor 23 is connected.

It should be understood that instead of a positive rail 13 and neutral rail 15, the rails 13, 15 could have any potential as long as the first rail 13 has a higher potential than the second rail 15. For example, the rail 13 could be neutral and the rail 15 could have a negative potential. Hence, the terms "positive" and "neutral" in relation to the power rails 13, 15 in this description could be replaced by "higher potential" and "lower potential".

When a positive pulse, referred to the neutral branch 15 of the power source, is provided on the input terminal 21 the gate voltage of the n-channel mosfet 5 will increase, and it will start to conduct. By the time the mosfet 5 starts to conduct the same time the capacitor 23 will already be charged, and will bootstrap the voltage back to the gates and saturate the n-channel mosfet. This will give the output side of the buffer at the interconnected sources of the mosfets 5, 7 a very clean and rapid drive up to the positive rail 13 of the power source. The saturated drive will continue as long as the capacitor 23 is not discharged through the resistor 17. That means that the maximum drive voltage to the gate of the power switch 3 is applied when needed to overcome the heavy charge to fully saturate in short time, thus minimize switching losses of the power switch 3. The short distinct delay provided by the capacitor 23 and resistor 17 before the n-channel mosfet 5 starts to conduct can be used to prevent cross-conduction in different types of dc/dc converter topologies. Because of the bootstrap provided by the capacitor 23 a large positive feedback with a high dynamic gain will be provided, thus minimizing the positive slope time, instead giving a fixed delay of the signal.

When a negative going signal is applied at the input terminal 21 the diode 19 will start to conduct and drain gate of the n-channel mosfet 5 so it will stop conducting and when the voltage drops more the p-channel mosfet 7 will start to conduct and drain the gate of the power switch 3. At the same time the capacitor 23 will drain the gate of the p-channel mosfet 7 and conduct a current so that a negative going voltage over gate to source over p-channel mosfet 7 is developed. This will saturate the negative going output signal of the driving stage completely to lower potential branch 15 at the output of the drive circuit. The dynamic gain is high due to the large positive feedback capacitor 23 is applying. This results in a fast going negative slope that goes to negative voltage. The nature of the negative going slope is of great use to ensure that the driven component 3 is properly drained. This is useful both for bipolar and mosfet transistors.

In the embodiment shown in FIG. 1 mosfet transistors 5, 7 are used in the drive circuit 1. As mentioned above, such transistors have inherent diodes between the source and the drain. Instead of mosfet transistors, bipolar transistors could be used.

Figure 2:
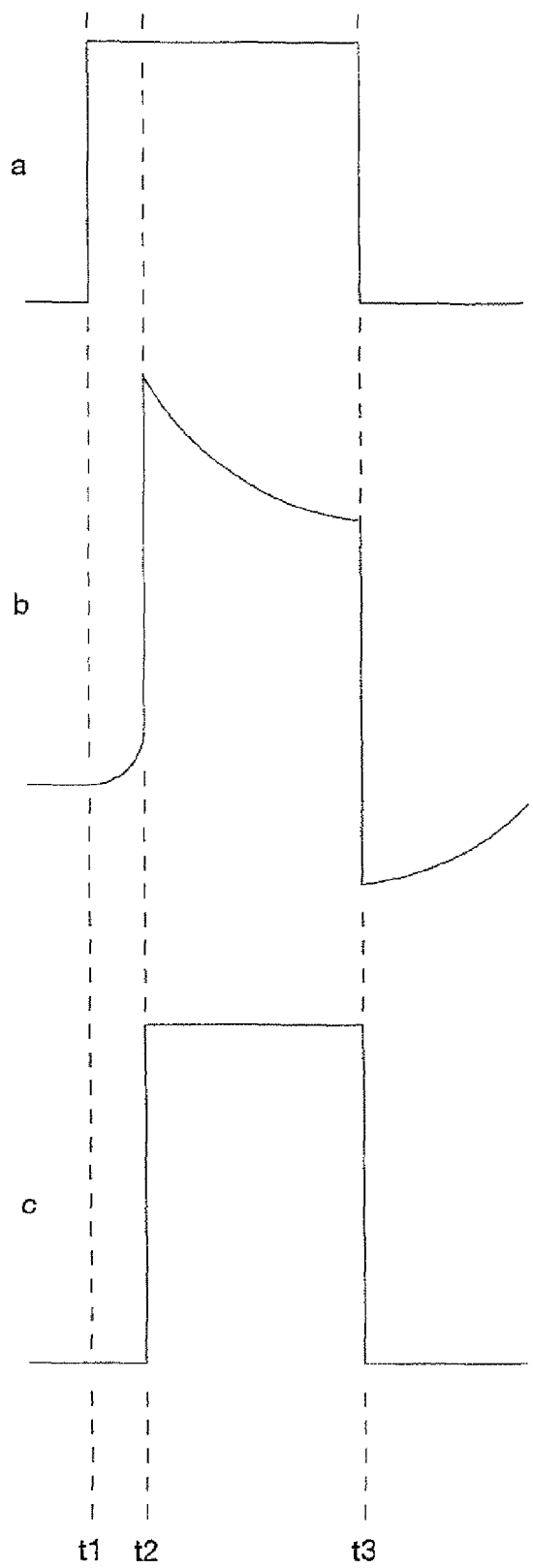
FIG. 2 illustrates the voltage variations at different points of the drive circuit before, during and after a voltage pulse is applied to the input of the drive circuit.

In this case, diodes would have to be provided between the emitter and the collector, in a corresponding way to the body-drain diodes 9, 11 illustrated in FIG. 1. FIG. 2 show three curves a, b and c, which are typical curves of the voltage between lower potential branch 15 and signal processes in the circuit. The vertical lines labelled t1-t3 signify points in time where different events occur in the circuit.

Curve a illustrates the signal over input terminal 21 referred to lower potential branch 15. At a first point in time t1 a positive going signal relative to the lower potential branch 15 is applied to the input terminal 21. At a third point in time t3 the signal on the input terminal 21 goes negative again.

Curve b illustrates the voltage on the gates of the n-channel mosfet 5 and the p-cannel mosfet 7 relative to the lower potential branch 15. At the first point in time t1, when a positive going signal referred to lower potential branch 15 is applied at input terminal 21, capacitor 23 starts to charge through the resistor 17 making a positive going slope. The time it takes to reach the conducting threshold of n-channel mosfet 5 is referred to as a dead time. When the n-channel mosfet's 5 conducting threshold is reached it starts to conduct, at the second point in time t2. Capacitor 23 will now act as a positive feedback element and bootstrap a positive voltage higher than the signal at input terminal 21 back to n-channel mosfet 5 gate and make it fully saturate to positive branch 13. This will cut down the switching time, therefore a very sharp positive going signal between lower potential branch and gate of the n-channel mosfet 5 is observed for the gate of the power switch 3. A fully saturated signal will be available as long as capacitor 23 does not discharge too much through the resistor 17. At the third point in time t3 the signal on the input terminal 21 goes negative and together with the body-drain diodes 11, 19 will create a negative going voltage over the gate of the n-channel mosfet 5 diode 19 speed up the process.

When the p-channel mosfet 7 reaches its conducting threshold it starts to conduct and the capacitor 23 will now act as a positive feedback element and bootstrap a negative voltage relative to the negative signal at input terminal 21 back to the p-channel mosfet 7 gate and make it fully saturate to negative branch 15. This will cut down switching time, therefore a very sharp negative going signal between higher potential branch 13 and gate of p-channel mosfet 7 is observed for the gate of the power switch 3.

Curve c illustrates the signal at the gate of the power switch 3 referred to lower potential branch 15. As can be seen, at the second point in time t2 the gate voltage of the power switch 3, that is, the output voltage from the driving circuit 1, increases sharply and stays at a high level until the third point in time t3, when the signal on the input 21 becomes low.

As will be appreciated, the signals shown in FIG. 2 are ideal signals. In reality a certain amount of time is needed for a signal to become high or low. Using the driving circuit according to the invention, however, these times are significantly reduced compared to the prior art.

The invention claimed is:

1. A drive circuit for a power switch component said drive circuit comprising:
    an input terminal for receiving a drive pulse;
    a first semiconductor component;
    a second semiconductor component;
    each of the first semiconductor component and second semiconductor component having a controllable terminal, a voltage amplifying terminal and a current amplifying terminal, the current amplifying terminals of said first and second semiconductor components being interconnected, the voltage amplifying terminal of the first semiconductor component being coupled to a first power rail and the voltage amplifying terminal of the second semiconductor component being coupled to a second power rail, the first power rail being at a higher potential than the second power rail, the controllable terminals of the first semiconductor component and second semiconductor component being interconnected;
    a resistor;
    a diode, the resistor and diode being coupled in parallel between said controllable terminals and the input terminal;
    a capacitor being coupled between said controllable terminals and said current amplifying terminals, wherein each of the first semiconductor component and second semiconductor component has a diode coupled between its current amplifying terminal and its voltage amplifying terminal.

2. The drive circuit according to claim 1, wherein the first and second semiconductor components are metal oxide semiconductor field effect transistors (MOSFETs), the controllable terminals are the gates of the MOSFETs, the voltage amplifying terminals are the drains and the current amplifying terminals are the sources, and the diodes are body-drain diodes inherent in the MOSFETs.

3. The drive circuit according to claim 1, wherein the first semiconductor component and the second semiconductor component are bipolar transistors, the controllable terminals are the bases of the transistors, the voltage amplifying terminals are the collectors and the current amplifying terminals are the emitters, and separate diodes are provided between each current amplifying terminal and voltage amplifying terminal.

4. The drive circuit according to claim 1, wherein the first semiconductor component and the second semiconductor component are isolated gate bipolar transistors, the controllable terminals are the gates of the transistors, the voltage amplifying terminals are the collector and the current amplifying terminals are the emitter, and separate diodes are provided between each current amplifying terminal and voltage amplifying terminal.

5. The drive circuit according to claim 1, further comprising a first power rail and a second power rail, wherein the second power rail is neutral and the first power rail has a positive potential.

6. The drive circuit according to claim 1, further comprising a first power rail and a second power rail, wherein the first power rail is neutral and the second power rail has a negative potential.

* * * * *

UNITED STATES PATENT AND TRADEMARK OFFICE
CERTIFICATE OF CORRECTION

| | | |
|---|---|---|
| PATENT NO. | : 7,965,127 B2 | Page 1 of 1 |
| APPLICATION NO. | : 12/681660 | |
| DATED | : June 21, 2011 | |
| INVENTOR(S) | : Svensson | |

It is certified that error appears in the above-identified patent and that said Letters Patent is hereby corrected as shown below:

Title Page, Item (73), under "Assignee", in Column 1, Line 1, delete "Stockton" and insert -- Stockholm --, therefor.

Signed and Sealed this
Eighteenth Day of October, 2011

David J. Kappos
*Director of the United States Patent and Trademark Office*